(12) United States Patent
Yu et al.

(10) Patent No.: US 7,138,654 B2
(45) Date of Patent: Nov. 21, 2006

(54) CHEMICAL-MECHANICAL POLISHING PROXIMITY CORRECTION METHOD AND CORRECTION PATTERN THEREOF

(75) Inventors: Tu-Hao Yu, Hsinchu (TW); Pai-Hsuan Sun, Kaohsiung (TW); Yu-Chia Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 247 days.

(21) Appl. No.: 10/801,884

(22) Filed: Mar. 15, 2004

(65) Prior Publication Data

US 2005/0142877 A1 Jun. 30, 2005

(30) Foreign Application Priority Data

Dec. 26, 2003 (TW) ................................. 92136980

(51) Int. Cl.
*H01L 23/58* (2006.01)
(52) U.S. Cl. ........................... 257/48; 257/52; 438/692; 451/241

(58) Field of Classification Search ................ 438/691, 438/692; 257/48, 620, 52; 451/376, 377, 451/241
See application file for complete search history.

(56) References Cited

U.S. PATENT DOCUMENTS 6,759,345 B1 * 7/2004 Kawano ..................... 438/759

* cited by examiner

*Primary Examiner*—Lan Vinh
(74) *Attorney, Agent, or Firm*—J.C. Patents

(57) ABSTRACT

A chemical-mechanical polishing (CMP) proximity correction method for polishing a wafer is provided. The wafer has a polish area and a protected area. The method includes forming a material layer over the wafer to cover the polish area and the protected area and then forming a protective layer over the material layer. Thereafter, the protective layer is patterned so that the remaining protective layer is at a distance away from the boundary of the polish area to reduce shadowing effects. Because the boundary of the protective layer above the material layer recedes to an area at a distance away from polish area, the whole polish area can be cleanly polished.

7 Claims, 4 Drawing Sheets

CHEMICAL-MECHANICAL POLISHING PROXIMITY CORRECTION METHOD AND CORRECTION PATTERN THEREOF

CROSS-REFERENCE TO RELATED APPLICATION

This application claims the priority benefit of Taiwan application serial no. 92136980, filed on Dec. 26, 2003.

BACKGROUND OF THE INVENTION

1. Field of the Invention

The present invention relates to a chemical-mechanical polishing (CMP) process. More particularly, the present invention relates to a chemical-mechanical polishing proximity correction method and correction pattern thereof for reducing shadowing effects.

2. Description of the Related Art

Many types of processes are used in the fabrication of semiconductor devices. However, photolithographic process is one of the most important because that is what the critical dimension (CD) and hence overall level of integration of the finished product depends. To increase the critical dimension in photolithography, a few methods for increasing the resolution of photomask such as optical proximity correction (OPC) and phase shift mask (PSM) has been developed.

The optical proximity correction is a method that attempts to eliminate the deviation of critical dimension due to proximity effect. Proximity effect is most prominent for a fabrication process with a small line width. An optical proximity correction method is applied to resolve proximity effect in the active area and the outer corners in U.S. Pat. No. 6,451,680, for example.

The aforementioned proximity effect also occurs when a chemical-mechanical polishing (CMP) operation is performed to polish a wafer in the fabrication of integrated circuit. In general, the problem is most significant in the corner region of a polish area.

FIG. 1 is a top view showing a conventional method of defining a wafer into a protected area and a polish area before performing a chemical-mechanical polishing operation. FIG. 2 is a cross-sectional view along line II—II of FIG. 1. As shown in FIGS. 1 and 2, a wafer 100 with device structures 200 therein is provided. The wafer 100 is divided into a polish area 102 and a protected area 104. Before carrying out a chemical-mechanical polishing operation, a material layer 202 is formed over the wafer 100 so that a portion of the material layer 202 within the polish area 102 is subsequently removed. To protect the device structures 200 outside the polish area 102, a protective layer is formed over the material layer 202 and then the protective layer within the polish area 102 is removed so that a protective layer 204 remains over the protected area 104.

In general, the upper surface of the protective layer 204 within the protected area 104 and the upper surface of the stop layer (the device structures 200) within the polish area 102 may not be at the same horizontal level. Typically, the protective layer 204 is at a slightly higher level. This causes the so-called shadowing effect at the boundary between the polish area 102 and the protected area 104. In other words, the material below the dash line in FIG. 2 (a boundary strip just outside the protected area 104) is very difficult to remove.

One solution to the shadowing effect is shown in FIG. 3. FIG. 3 is a schematic cross-sectional view showing another conventional method of defining a wafer into a protected area and a polish area before performing a chemical-mechanical polishing operation. As shown in FIG. 3, the wafer 300 is divided into a polish area 302 and a protected area 304. Furthermore, device structures 301 and 303 are formed in the polish area 302 and the protected area 304 of the wafer 300 respectively. The stop layer within the polish area 302 (the upper section of the device structure 301) is raised to match the top surface of the protective layer 308 within the protected area 304. Since the top of the device structure 301 is at a higher or the same level as the top surface of the protective layer 308, shadowing effect is eliminated after the material layer 306 is removed in a chemical-mechanical polishing operation. However, this method demands a major modification of the device structures inside a wafer and hence unsuitable for fabricating most semiconductor devices.

SUMMARY OF THE INVENTION

Accordingly, at least one objective of the present invention is to provide a chemical-mechanical polishing proximity correction method applied to a semiconductor fabrication process for reducing shadowing effects.

At least a second objective of the present invention is to provide a chemical-mechanical polishing proximity correction method for reducing shadowing effect, simplifying processing steps and increasing polishing efficiency.

At least a third objective of the present invention is to provide a correction pattern for chemical-mechanical polishing proximity correction designed according to the pattern on a polish area so that shadowing effects are reduced.

To achieve these and other advantages and in accordance with the purpose of the invention, as embodied and broadly described herein, the invention provides a chemical-mechanical polishing proximity correction method for polishing a wafer. The wafer has a polish area and a protected area. First, a material layer covering the protected area and the polish area of the wafer is formed. Thereafter, a protective layer is formed over the material layer. The protective layer is patterned so that the edges of the remaining protective layer are at a distance away from the boundary of the polish area for reducing the shadowing effects.

The present invention also provides an alternative chemical-mechanical polishing proximity correction method for polishing a wafer with a polish area. The polish area has a plurality of edges and at least a corner. First, a plurality of peripheral shadow areas is set up outside the boundary of the polish area. The peripheral shadow areas have a first width. In addition, a corner shadow area is set up outside the corner of the polish area. The corner shadow area has a second width greater than the first width. Thereafter, a protective area is formed outside the peripheral shadow area and the corner shadow area.

According to the chemical-mechanical polishing proximity correction method of the present invention, the second width of the corner shadow area for a straight corner in the polish area must satisfy the following relation:

$$W = A + D = A + (C/\sqrt{2}) = A + (B/2)$$

where W is the second width, A is the first width, C is the shortest distance between a line joining the end points of the outer edges of two neighboring peripheral shadow areas and the corner of the polish area, B is the distance from a cross point between the aforementioned line and the boundary of the polish area to the corner and D is the difference between the second width and the first width.

The present invention also provides a correction pattern for chemical-mechanical polishing proximity correction. The correction pattern on a wafer comprises a polish area, a shadow area and a protected area. The shadow area includes at least a plurality of peripheral sections and a corner section. The polish area has a plurality of edges and at least a corner. The shadow area is set up outside the polish area. The peripheral sections of the shadow area are set up outside the boundary of the polish area and the corner section of the shadow area is set up outside the corner of the polish area. The peripheral section has a first width and the corner section has a second width such that the second width is greater than the first width. The protected area is set up outside the polish area and the shadow area.

According to the correction pattern for chemical-mechanical polishing proximity correction of the present invention, the second width of the corner shadow area for a straight corner in the polish area must satisfy the following relation:

$$W=A+D=A+(C/\sqrt{2})=A+(B/2)$$

where W is the second width, A is the first width, C is the shortest distance between a line joining the end points of the outer edges of two neighboring peripheral shadow areas and the corner of the polish area, B is the distance from a cross point between the aforementioned line and the boundary of the polish area to the corner and D is the difference between the second width and the first width.

In the present invention, the border of the protective layer is pushed back to an area at a distance away from the boundary of the polish area to eliminate the shadowing effects. Thus, the entire polish area can be cleanly polished.

Furthermore, a shadow area is set up between the polish area and the protected area to isolate the area that may contribute to the shadowing effects. Thus, the shadowing effect can be eliminated using a conventional semiconductor process. Ultimately, the number of processing steps is reduced and the polishing efficiency is increased.

In addition, increasing the width at the corner shadow area relative to the peripheral shadow area is able to decrease the degree of over-polishing between the central and peripheral area of the polish area. Therefore, the present invention is capable of improving the uniformity of the chemical-mechanical polishing operation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
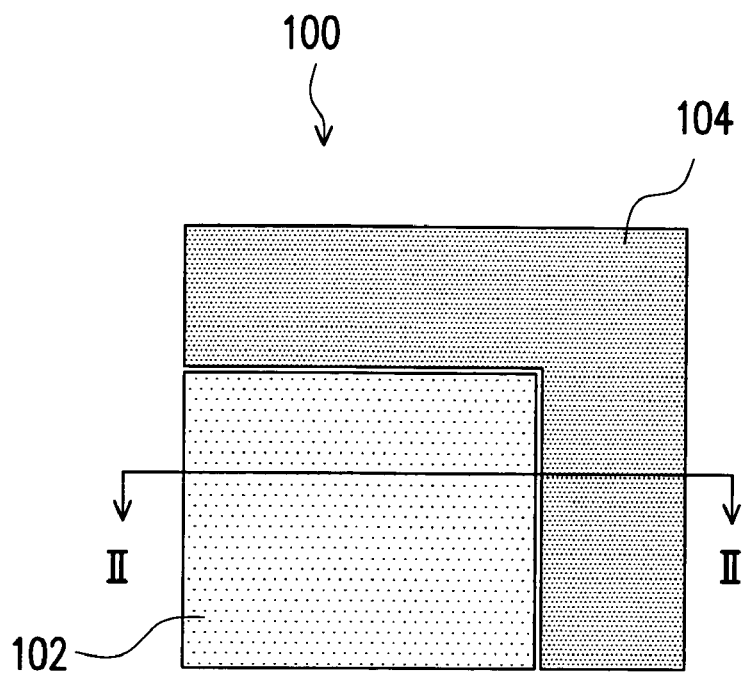
FIG. 1 is a top view showing a conventional method of defining a wafer into a protected area and a polish area before performing a chemical-mechanical polishing operation.
Figure 2:
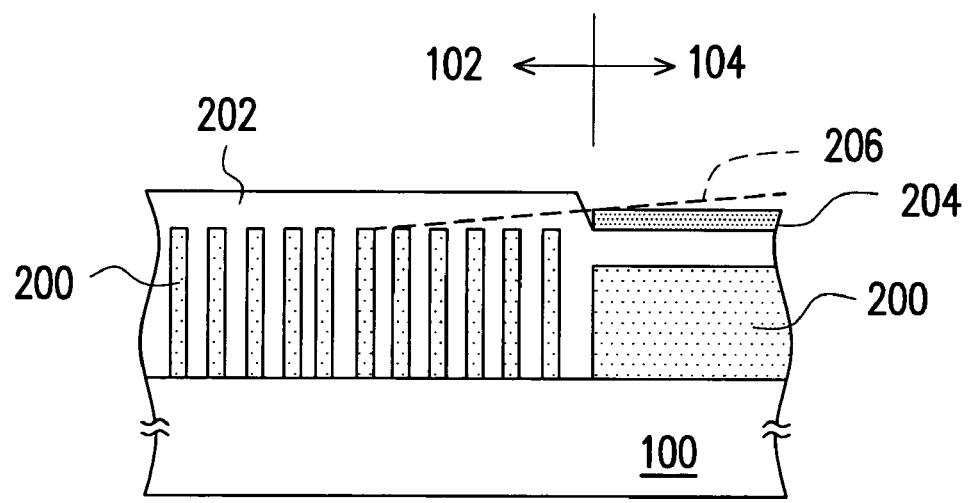
FIG. 2 is a cross-sectional view along line II—II of FIG. 1.
Figure 3:
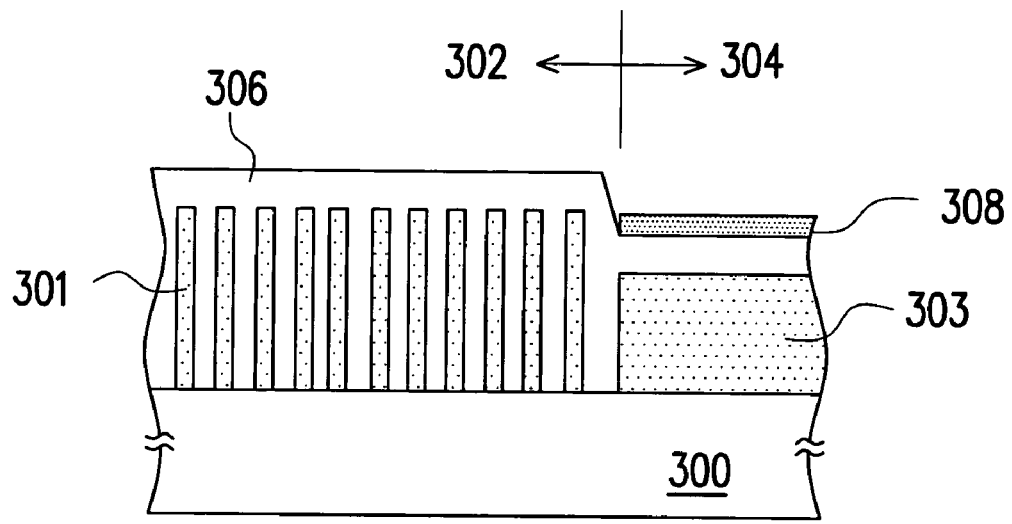
FIG. 3 is a schematic cross-sectional view showing another conventional method of defining a wafer into a protected area and a polish area before performing a chemical-mechanical polishing operation.

Reference will now be made in detail to the present preferred embodiments of the invention, examples of which are illustrated in the accompanying drawings. Wherever possible, the same reference numbers are used in the drawings and the description to refer to the same or like parts.

Figure 4:
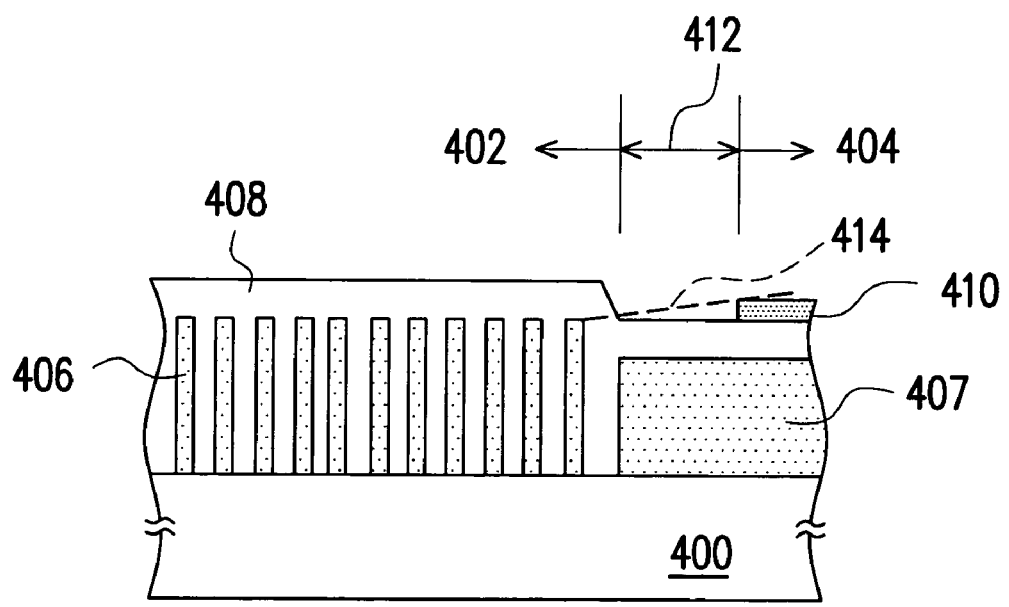
FIG. 4 is a schematic cross-sectional view of a wafer for showing a chemical-mechanical polishing proximity correction method according to a first embodiment of the present invention.

FIG. 4 is a schematic cross-sectional view of a wafer for showing a chemical-mechanical polishing proximity correction method according to a first embodiment of the present invention. As shown in FIG. 4, the proximity correction method is suitable polishing a wafer 400 having a polish area 402 thereon. First, a material layer 408 is formed over the wafer 400 to cover the polish area 402. However, before forming the material layer 408, device structures 406 may form within the polish area 402 to serve as a stop layer and other device structures 407 may form within other non-polish areas. Thereafter, a protective layer 410 is formed over the material layer 408. The upper surface of the protective layer 410 is at a level higher than the top section of the device structures 406, for example. The protective layer 410 is patterned such that the remaining portion of the protective layer 410 is at a distance away from the boundary of the polish area 401 for eliminating the shadowing effects. The magnitude of this distance is critical to the subsequent chemical-mechanical polishing process. For example, when the protective layer 410 on the wafer 400 is defined as a protected area 404, the area between the polish area 402 and the protected area 410 becomes a shadow area 412. The width of this shadow area 412 is the distance between the protective layer 410 and the boundary of the polish area 402 that isolates the polish area 402 and the protective layer 410 within the protected area 404. With this setup, shadowing effects that normally prevents the removal of material from the material layer 408 (the area under the dash line 414 in FIG. 4) in a chemical-mechanical polishing operation no longer persists. Furthermore, the process can be applied in most semiconductor fabrication process to simplify the processing steps and increase the polishing efficiency.

Figure 5:
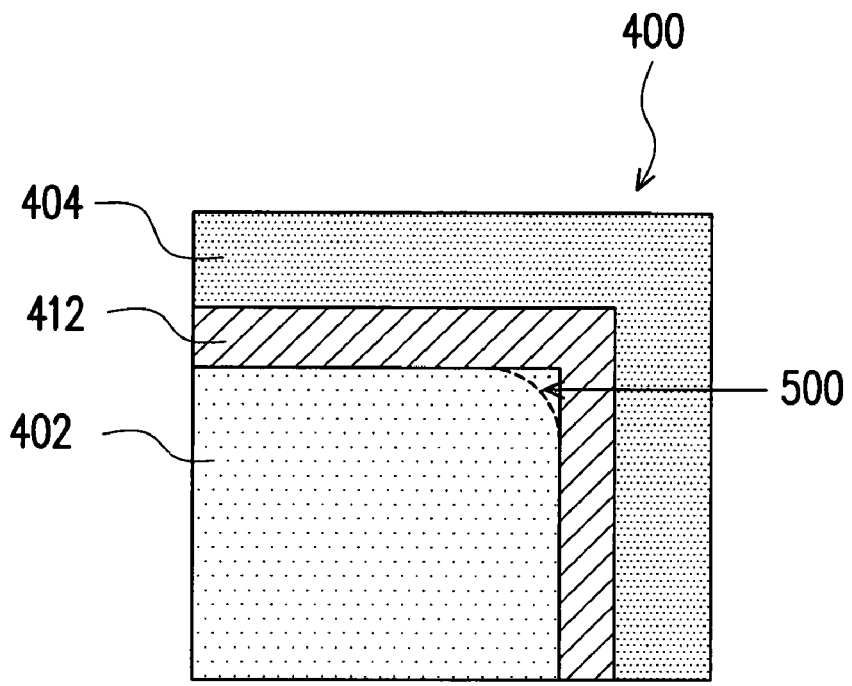
FIG. 5 is a top view of the correction pattern on a wafer for chemical-mechanical polishing proximity correction according to the first embodiment of the present invention.

However, when the polish region has a corner, shadowing effect at the corner may lead to different degree of over-polishing between the central and the peripheral region of the polish area. FIG. 5 is a top view of the correction pattern on a wafer for chemical-mechanical polishing proximity correction according to the first embodiment of the present invention. In FIG. 5, some elements such as the material layer, the device structures and the protective layers are omitted. As shown in FIG. 5, the wafer 400 has a polish area 402, a shadow area 412 and a protected area 404. Due to the shadowing effect at the corner, the corner area 500 within the polish area 402 is particularly hard to polish so that this area needs to be polished a little longer. Yet, if the polishing the corner area 500 is large or polishing layer is thick, the degree of over-polishing between the central and the peripheral polish area 402 is great. Ultimately, uniformity of the polish area 402 after the chemical-mechanical polishing operation is poor. Nevertheless, pushing back the protected area 404 to reduce the shadowing effects at the corner may polish away a portion of the shadow area 412 and remove the protective capacity for the protected area 404.

Figure 6:
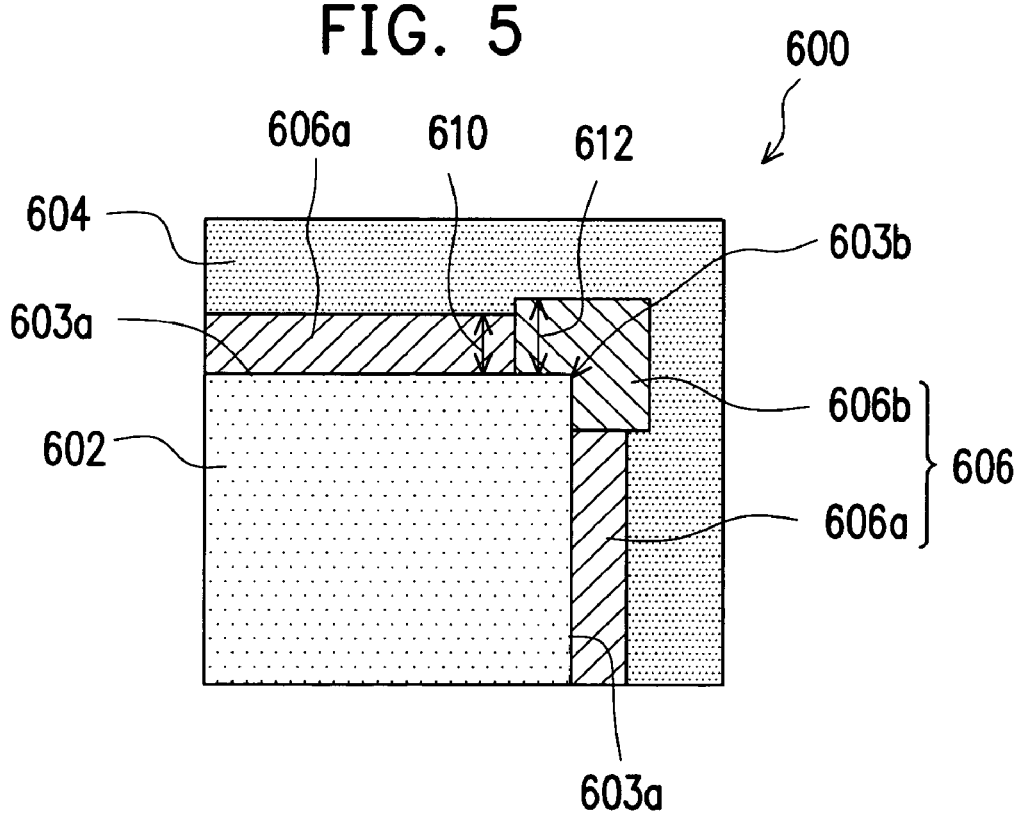
FIG. 6 is a top view of the correction pattern on a wafer for chemical-mechanical polishing proximity correction according to a second embodiment of the present invention.

FIG. 6 is a top view of the correction pattern on a wafer for chemical-mechanical polishing proximity correction according to a second embodiment of the present invention. As shown in FIG. 6, the second embodiment can be applied to a wafer having at least a polish area 602. The polish area 602 has a boundary 603a and a corner 603b. First, a plurality of peripheral shadow areas 606a is set up outside the boundary 603a of the polish area 602. The peripheral shadow areas 606a have a first width 610. Furthermore, a corner shadow area 606b is set up outside the corner 603b of the polish area 602. The corner shadow area 606b has a second width 612 such that the second width 612 is greater than the first width 610. A protected area 604 is set up outside the shadow area 606 comprising the peripheral shadow areas 606a and the corner shadow area 606b.

Figure 7:
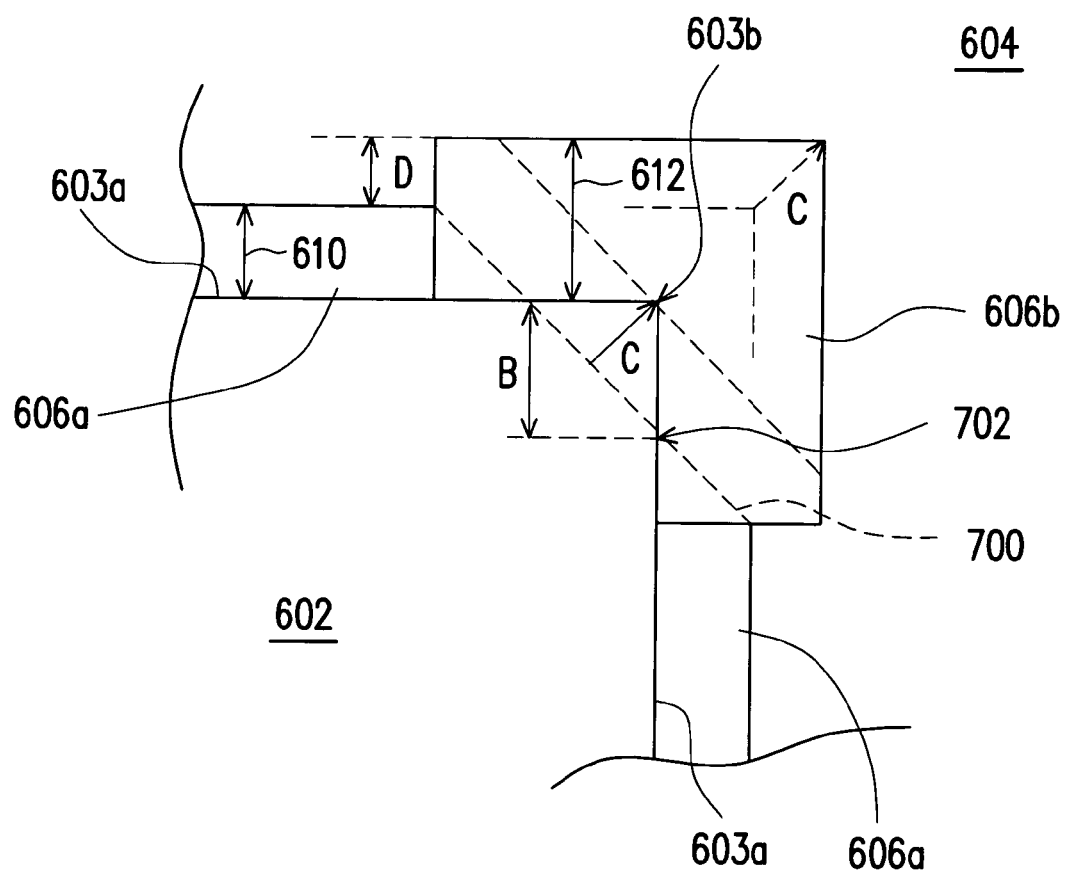
FIG. 7 is a magnified view of a portion of the correction pattern according to the second embodiment of the present invention.

FIG. 7 is a magnified view of a portion of the correction pattern according to the second embodiment of the present invention. As shown in FIG. 7, the corner shadow area 606b and the peripheral shadow areas 606a have to follow a definite size relationship. The second width 612 of the corner shadow area 606b when the corner 603b of the polish area 602 is a straight corner must satisfy the following relation:

$$W = A + D = A + (C/\sqrt{2}) = A + (B/2)$$

where W is the second width 612, A is the first width 610, C is the shortest distance between a line 700 joining the end points of the outer edges of two neighboring peripheral shadow areas 606a and the corner 603b of the polish area 602, B is the distance from a cross point 702 between the aforementioned line 700 and the boundary 603a of the polish area 602 to the corner 603b and D is the difference between the second width 612 and the first width 610. Typically, the first width 610 or A is set between 1~20 μm, distance B is set between 0.5~5 μm. Obviously, when the corner 603b in the polish area 602 is not a straight corner, the second width 612 of the corner shadow area 606b can still be determined according to the area affected by the corner shadowing effect.

In summary, the present invention utilizes the proximity correction method. The border of the protective layer is pushed back to an area at a distance away from the boundary of the polish area and the protective layer close to the corner area is pushed back from the corner of the polish area even further. Hence, shadowing effects can be completely eliminated and the entire polish area can be cleanly polished.

Furthermore, a shadow area is set up between the polish area and the protected area to isolate the area that may contribute to the shadowing effects. Thus, the shadowing effect can be eliminated using conventional semiconductor processes, thereby reducing the number of processing steps and increasing the polishing efficiency.

In addition, increasing the width at the corner shadow area relative to the peripheral shadow area is able to decrease the degree of over-polishing between the central and peripheral area of the polish area and hence increase polishing uniformity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A correction pattern for a chemical-mechanical polishing proximity correct, comprising:
    a polish area over a wafer, wherein the polish area has a plurality of boundaries and at least a corner;
    a protective region set up outside the polish area;
    a shadow area set up between the polish area and the protection region, wherein the shadow area at least comprises:
        a plurality of peripheral sections set up along the boundaries of the polish area, wherein the peripheral sections have a first width; and
        at least a corner section set up along the corner of the polish area, wherein the corner section connects the adjacent peripheral sections, and the corner section has a second width such that the second width is greater than the first width.

2. The correction pattern of claim 1, wherein the peripheral sections have a first width between 1~20 μm.

3. The correction pattern of claim 1, wherein the corner within the polish area is a straight corner.

4. The correction pattern of claim 3, wherein the second width of the corner shadow area is set according to the following relation:

$$W = A + D = A + (C/\sqrt{2}) = A + (B/2)$$

where W is the second width,
    A is the first width, wherein the first width is between 1~20 μm,
    C is the shortest distance between a line joining the end points of the outer edges of two neighboring peripheral shadow areas and the corner of the polish area,
    B is die distance from a cross point between the aforementioned line and the boundary of the polish area to the corner, wherein B is between 0.5~5 μm, and
    D is the difference between the second width and the first width.

5. The correction pattern of claim 1, wherein the polish area further comprises at least a device structure set up on the wafer.

6. The correction pattern of claim 5, wherein the polish area further comprises a material layer form over the device structure.

7. The correction pattern of claim 6, wherein the protected area further comprises a protective layer formed over the material layer.

* * * * *